United States Patent
Sasaki et al.

(10) Patent No.: US 9,833,817 B2
(45) Date of Patent: Dec. 5, 2017

(54) GAS PURGE UNIT, LOAD PORT APPARATUS, AND INSTALLATION STAND FOR PURGING CONTAINER

(71) Applicant: TDK Corporation, Minato-ku, Tokyo (JP)

(72) Inventors: Mutsuo Sasaki, Tokyo (JP); Jun Emoto, Tokyo (JP); Hiroshi Igarashi, Tokyo (JP)

(73) Assignee: TDK Corporation, Tokyo (JP)

( * ) Notice: Subject to any disclaimer, the term of this patent is extended or adjusted under 35 U.S.C. 154(b) by 42 days.

(21) Appl. No.: 15/166,903

(22) Filed: May 27, 2016

(65) Prior Publication Data

US 2017/0025299 A1 Jan. 26, 2017

(30) Foreign Application Priority Data

May 28, 2015 (JP) .................. 2015-108741

(51) Int. Cl.
*H01L 21/673* (2006.01)
*B08B 5/00* (2006.01)
*B08B 9/08* (2006.01)
*H01L 21/677* (2006.01)

(52) U.S. Cl.
CPC .......... *B08B 5/00* (2013.01); *B08B 9/08* (2013.01); *H01L 21/67393* (2013.01); *H01L 21/67772* (2013.01)

(58) Field of Classification Search
CPC ....... B08B 5/00; B08B 9/08; H01L 21/67772; H01L 21/67393; H01L 21/67389
See application file for complete search history.

(56) References Cited

U.S. PATENT DOCUMENTS

| 7,950,524 | B2 * | 5/2011 | Lin ................... F16K 15/147 118/715 |
| 8,061,738 | B2 * | 11/2011 | Okabe ................ F16J 15/002 15/301 |
| 8,418,733 | B2 * | 4/2013 | Shikata ................... G03F 1/00 141/4 |
| 9,105,673 | B2 * | 8/2015 | Babbs ............. H01L 21/67201 |
| 2002/0017237 | A1 * | 2/2002 | Wirth ..................... B08B 3/04 118/500 |
| 2005/0069420 | A1 * | 3/2005 | Miyajima ........ H01L 21/67017 417/53 |
| 2016/0038982 | A1 | 2/2016 | Sasaki et al. |
| 2016/0276189 | A1 * | 9/2016 | Igarashi ........... H01L 21/67393 |
| 2017/0025296 | A1 * | 1/2017 | Emoto ............. H01L 21/67389 |

FOREIGN PATENT DOCUMENTS

| JP | 2010-182747 A | 8/2010 |
| JP | 2012-164948 A | 8/2012 |
| JP | 2014-036185 A | 2/2014 |
| JP | 5776828 B1 | 9/2015 |

* cited by examiner

*Primary Examiner* — Nicolas A Arnett
(74) *Attorney, Agent, or Firm* — Arent Fox LLP

(57) ABSTRACT

A gas purge unit includes an intake nozzle 28, a pivotable body 31, and an O-ring 35. The intake nozzle 28 has a nozzle opening 26 flowing out a cleaning gas. The pivotable body 31 is arranged in ring shape to surround a cylindrical projection 28b of the nozzle 28, and is provided with a contact part 34 capable of detachably contacting with an intake port 5 on a tip portion of the pivotable body 31. The ring-shaped O-ring 33 is held between a rear end of the pivotable body 31 and a base portion 28a of the nozzle 28 in a compressively elastically deformable manner along a longitudinal direction of the cylindrical projection 28b.

19 Claims, 12 Drawing Sheets

FIG. 2
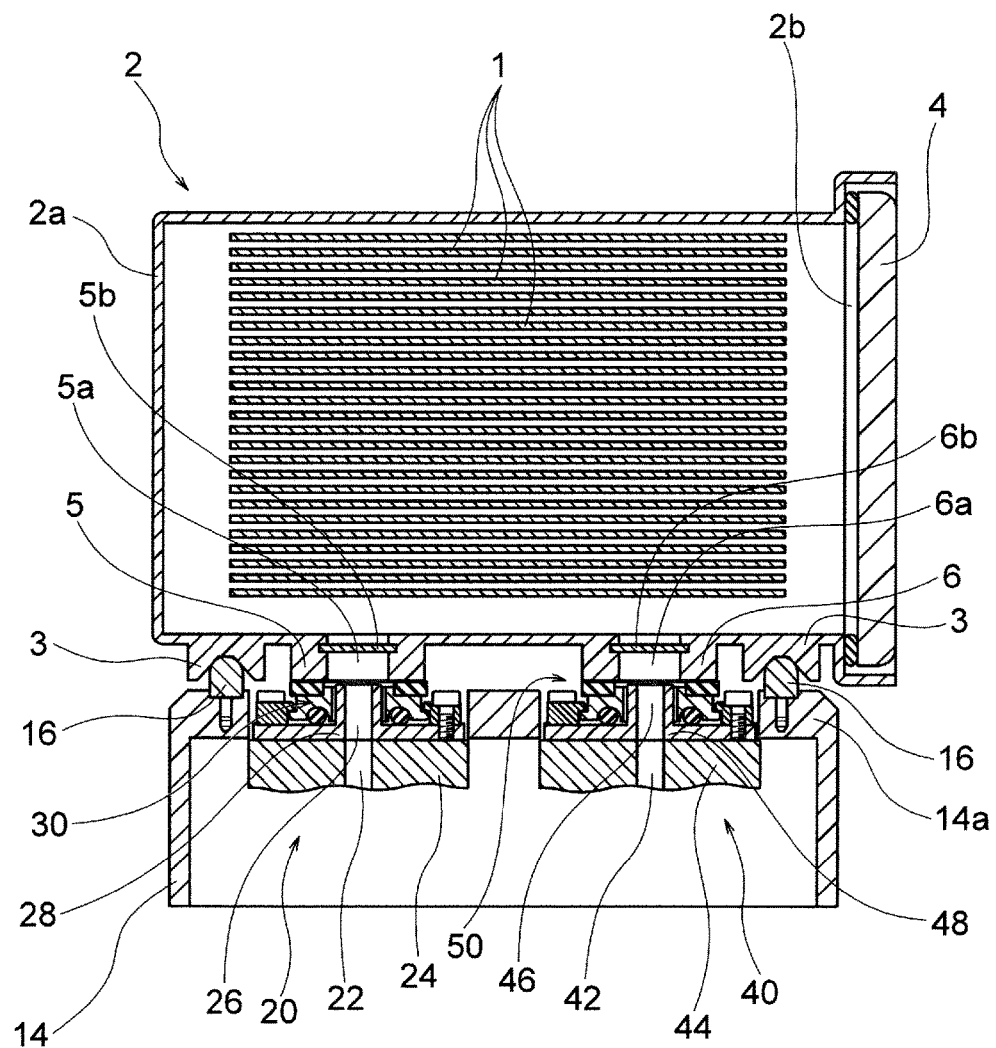
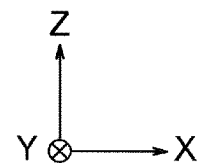

GAS PURGE UNIT, LOAD PORT APPARATUS, AND INSTALLATION STAND FOR PURGING CONTAINER

CROSS-REFERENCE TO RELATED APPLICATION

This application claims the priority of Japanese Patent Application No. 2015-108741, filed on May 28, 2015.

BACKGROUND OF THE INVENTION

1. Field of the Invention

The present invention relates to a gas purge unit, a load port apparatus, and an installation stand for purging container.

2. Description of the Related Art

For example, manufacturing process of semiconductors includes the following technique (bottom purge) a gas supply nozzle is arranged on an installation stand of a load port apparatus and is made contact with a gas supply port provided at a bottom part of a wafer transport container to introduce a purge gas therethrough and clean the inner atmosphere of the wafer transport container by the purge gas.

In such a technique, the gas supply nozzle and the gas supply port may be dislocated due to positional variation or inclination of the gas supply port. This space causes a problem of leakage of inert gas supplied from the gas supply nozzle or a problem of intrusion of the outside air into the wafer transport container via the space.

To solve such a problem, mechanisms for pivotting a nozzle body or a tip of the nozzle are disclosed (see Patent Document 1 and Patent Document 2). In these mechanisms, however, a nozzle member having a nozzle opening or part thereof is pivoted, and thus there is a limit to make nozzle structure smaller.

Also, these techniques need a portion where an elastic member is rubbed to pivot a nozzle member having a nozzle opening or part thereof and ensure sealing property. Thus, rubbing chips (particles) generated by friction of the portion may flow into a water transport container via a passage.

In the conventional techniques, a space may be generated between a nozzle tip and a supply part when only a small amount of extraneous matter is generated at the rubbed portion to worsen the motion of the pivoted portion and hinder followingness.

Patent Document 1: Japanese Patent Laid-Open No. 2012-164948

Patent Document 2: Japanese Patent Laid-Open No. 2014-36185

SUMMARY OF THE INVENTION

The present invention has been achieved in consideration of the circumstances. It is an object of the invention to provide a gas purge unit, a load port apparatus, and an installation stand for purging container, all of which are excellent in seal performance between a flowing opening and a nozzle opening, and are capable of filling inside the purging container with cleaning gas without mixing particles or so.

To achieve the above object, the gas purge unit according to a first aspect of the present invention is for flowing a cleaning gas into a purging container having, a flowing port with a flowing opening via the flowing port, and comprises:

a nozzle member provided with a nozzle opening for flowing the cleaning gas and a cylindrical projection projecting from an upper surface of a base portion to upward;

a pivotable body arranged in ring shape on the base portion to surround the cylindrical projection with a first space and provided with a contact part capable of detachably contacting with the flowing port on a tip portion of the pivotable body; and a first pivot support portion with ring shape held between a rear end of the pivotable body and the base portion in a compressively elastically deformable manner along a longitudinal direction of the cylindrical projection, wherein:

the contact part is composed of an elastic member;

a second space is formed between the rear end of the pivotable body and the upper surface of the base portion;

the first space and the second space allow the pivotable body to pivot with respect to the nozzle member and absorb an angle of inclination of the pivotable body; and the pivotable support portion is compressively elastically deformed in a range of the first space and the second space.

In the gas purge unit according to the first aspect of the present invention, the flowing port (intake port or exhaust port, in the same hereinafter) of the purging container detachably contacts with the contact part, which is formed at the tip portion of the pivotable body provided around the cylindrical projection of the nozzle member. The pivotable body with the contact part is supported by the ring-shaped first pivot support portion, and it compressively elastically deforms along the longitudinal direction of the cylindrical projection. Then, the pivotable body can pivot.

Thus, even when the flowing port is displaced positionally or inclined due to positional displacement or inclination of the purging container, the first pivot support portion compressively elastically deforms, which makes the pivotable body pivot in accordance with positional displacement or inclination of the purging container. As a result, the contact part formed at the tip portion of the pivotable body closely contacts with the flowing port around the flowing opening; (intake opening or exhaust opening, in the same hereinafter).

The ring-shaped first pivot support portion is arranged between the rear end of the pivotable body and the base portion of the nozzle member in an elastically deformable manner, and functions as a seal member. Thus, the seal performance therebetween is maintained. Thus, the pivotable body can satisfactorily seal the nozzle opening and the flowing opening isolated from outside air, and they can be airtightly connected.

Since the contact part is composed of elastic member, the flowing port and the pivotable body closely contact with each other even if the flowing port, where the contact part contacts, is composed of hard material. In this respect too, the pivotable body can satisfactorily seal the nozzle opening and the flowing opening isolated from outside air, and they can be airtightly connected. Note that, this is the case even if the flowing port, where the contact part contacts, is composed of soft material.

Thus, the cleaning gas supplied (or exhausted, in the same hereinafter) from the nozzle opening can flow from the flowing opening into (or exhausted, in the same hereinafter) the purging container without leaking to outside or mixing outside air thereinto. Then, the inside thereof can be satisfactorily filled with the gas and maintained in a clean condition.

Note that, the first pivot support portion just compressively elastically deforms between the rear end of the pivotable body and the base portion of the nozzle member, and is then hardly rubbed. Thus, particles or so due to rubbing hardly occur. Further, since the compressive and elastic deformation of the first pivot support portion enables the pivotable body to pivot, the pivotable portion moves smoothly, following capability is excellent, and a clearance between a tip of a nozzle member and an intake port hardly occurs.

Further, since the nozzle opening of the nozzle member, a movable portion (pivotable body), and a position adjusting portion (first pivot support portion) are independently constituted, the nozzle itself is not inclined and lowering of movability caused by a deposition on the nozzle hardly occurs, so that the seal performance does not deteriorate. In addition, the nozzle itself is not inclined, which makes it easier to supply the cleaning gas thereto. Further, since an elastically deformable portion should just be formed in a local position, the nozzle can be made smaller as a whole.

Since the pivotable body is arranged in a ring shape to surround the cylindrical projection, the nozzle opening and the pivotable body are positioned in the self-alignment manner. The nozzle opening is formed at the tip of the cylindrical projection, which makes a distance between the first pivot support portion and the nozzle opening larger. As a result, there is little risk that particles possibly caused by the first pivot support portion are mixed from the nozzle opening into the purging container.

The contact part may be arranged to protrude toward the purging container more than a tip of the cylindrical projection. By arranging the contact part in this way, it is possible to effectively prevent the tip oldie nozzle member (tip of the cylindrical projection) from impacting on the flowing port. Note that, when the tip of the nozzle member goes into the flowing opening without impacting on the flowing port, the contact part may not be arranged to protrude toward the purging container more than the tip of the cylindrical projection.

The gas purge unit according to the first aspect of the present invention may further comprise a second pivot support portion with ring shape held between an inner circumferential portion of the pivotable body and an outer circumferential portion of the cylindrical projection in a compressively elastically deformable manner along a direction vertical to the longitudinal direction of the cylindrical projection. In this case, the first and second pivot support portions function as two seal members, and seal performance between the nozzle member and the pivotable body can be further improved. In addition, the second pivot support portion is provided, so that it is possible to effectively prevent the inner circumferential surface of the pivotable body from impacting on the outer circumferential surface of the cylindrical projection even if the pivotable body pivots.

The gas purge unit according to the first aspect of the present invention may further comprise a stopper member configured to restrict the pivotable body to moving from the base portion of the nozzle member toward the flowing port and configured to fail to restrict the pivotable body to moving toward the base portion. In that case, when the nozzle member is detached from the flowing port, the pivotable body is forced to be detached from the flowing port along with the node member, so that it is possible to effectively prevent the contact part of the pivotable body from adhering to the intake port.

The gas purge unit according to a second aspect of the present invention is for flowing a cleaning gas into a purging container having a flowing port with a flowing opening via the flowing port, and comprises:

a nozzle member provided with a nozzle opening for flowing the cleaning gas on a top surface of a base portion;

a pivotable body arranged in ring shape on the base portion to surround the nozzle opening and provided with a contact part capable of detachably contacting with the flowing port;

a pivot support portion with ring shape held between a rear end of the pivotable body and the base portion of the nozzle member in a compressively elastically deformable manner; and a stopper member configured to restrict the pivotable body to moving from the base portion of the nozzle member toward the flowing port and configured to fail to restrict the pivotable body to moving toward the base portion, wherein:

the contact part is composed of an elastic member;

a space is formed between the rear end of the pivotable body and the upper surface of the base portion so as to allow the pivotable body to pivot with respect to the nozzle member and absorb an angle of inclination of the pivotable body; and the pivotable support portion is compressively elastically deformed in a range of the space.

In the gas purge unit according to the second aspect of the present invention, the flowing port of the purging container detachably contacts with the contact part formed at the tip portion of the pivotable body. The pivotable body with the contact part is supported by the ring-shaped pivot support portion, and it deforms compressively elastically. Then, the pivotable body pivots.

Thus, even when the flowing port is displaced positionally or inclined due to positional displacement or inclination of the purging container, the pivot support portion compressively elastically deforms, which makes the pivotable body pivot in accordance with positional displacement or inclination of the purging container. As a result, the contact part formed at the tip portion of the pivotable body closely contacts with the flowing port around the flowing opening.

The ring-shaped pivot support portion is arranged between the rear end of the pivotable body and the base portion of the nozzle member in an elastically deformable manner, and functions as a seal member. Thus, the seal performance therebetween is maintained. Thus, the pivotable body can satisfactorily seal the nozzle opening and the flowing opening isolated from outside air, and they can be airtightly connected.

Since the contact part is composed of elastic member the flowing port and the pivotable body closely contact with each other even if the flowing port, where the contact part contacts, is composed of hard material. In this respect too, the pivotable body can satisfactorily seal the nozzle opening and the flowing opening isolated from outside air, and they can be airtightly connected. Note that, this is the case even if the flowing port, where the contact part contacts, is composed of soft material.

Thus, the cleaning gas supplied from the nozzle opening can flow from the flowing opening into the purging container without leaking to outside or mixing outside air thereinto. Then, the inside thereof can be satisfactorily filled with the gas and maintained in a clean condition.

Note that, the pivot support portion just compressively elastically deforms between the rear end of the pivotable body and the base portion of the nozzle member, and is then hardly rubbed. Thus, particles or so due to rubbing hardly occur. Further, since the compressive and elastic deformation of the pivot support portion enables the pivotable body to pivot, the pivotable portion moves smoothly, following capability is excellent, and a clearance between a tip of a nozzle member and an intake port is hardly formed.

Further, since the nozzle opening of the nozzle member, a movable portion (pivotable body), and a position adjusting portion (pivot support portion) are independently constituted, the nozzle itself is not inclined and lowering of movability caused by a deposition on the nozzle hardly occurs, so that the seal performance does not deteriorate. In addition, the nozzle itself is not inclined, which makes it easier to supply the cleaning gas thereto. Further, since an elastically deformable portion should just be loaned in a local position, the nozzle can be made smaller as a whole.

The gas purge unit according to the second aspect of the present invention comprises a stopper member configured to restrict the pivotable body to moving from the base portion of the nozzle member toward the flowing port and configured to fail to restrict the pivotable body to moving toward the base portion. Thus, when the nozzle member is detached from the flowing port, the pivotable body is forced to be detached from the flowing port along with the nozzle member, so that it is possible to effectively prevent the contact part of the pivotable body from adhering to the intake port. Further, the stopper member also has a function of aligning the pivotable body and the nozzle opening of the nozzle member.

The pivotable body may have the contact part composed of an elastic member and a pivotable base portion joined with the contact part and the pivotable base portion may be composed of metal. Since the pivotable base portion is composed of metal, a portion where the pivotable base portion is needed can be reduced to the minimum, and a risk of generation of particles etc. can be further reduced. Note that, the contact part and the pivotable base portion may be formed integrally by elastic member. After the contact part and the pivotable base portion are formed integrally by elastic member, only the pivotable base portion may have an enhanced rigidity compared with other portions. On the contrary, the contact part and the pivotable base portion may be famed integrally by a high rigidity member, and only the contact part may have an enhanced elasticity.

A housing recess to which the contact part is attached and a positioning projection located inside a radial direction of the housing recess may be formed on the pivotable base portion. The positioning projection allows the contact part composed of elastic member to be favorably positioned with respect to the pivotable base and attached thereto.

The elastic member may be composed of rubber material discharging little outgas. This configuration can reduce a risk of containing organic component gas in the cleaning gas and improve cleanliness in the purging container. Note that, the pivot support portion (including both the first pivot support portion and the second pivot support portion) may be also composed of rubber material discharging little outgas.

The contact part may be a flat surface. A convex portion may be formed on the contact part. The contact part may be a tapered slope formed at the tip of the pivotable body.

A load port apparatus of the present invention includes the above-mentioned gas purge unit. An installation stand for a purging container of the present invention includes the above-mentioned gas purge unit. The gas purge unit of the present invention may be placed on other devices or other locations.

BRIEF DESCRIPTION OF THE DRAWINGS

FIG. 2 is a cross-sectional view showing a relation between the gas purge unit assembled in the load port apparatus shown in FIG. 1 and a FOUP as a purging container.

DESCRIPTION OF THE PREFERRED EMBODIMENTS

Hereinafter, the present invention will be explained based on embodiments shown in the figures.

First Embodiment

Figure 1:
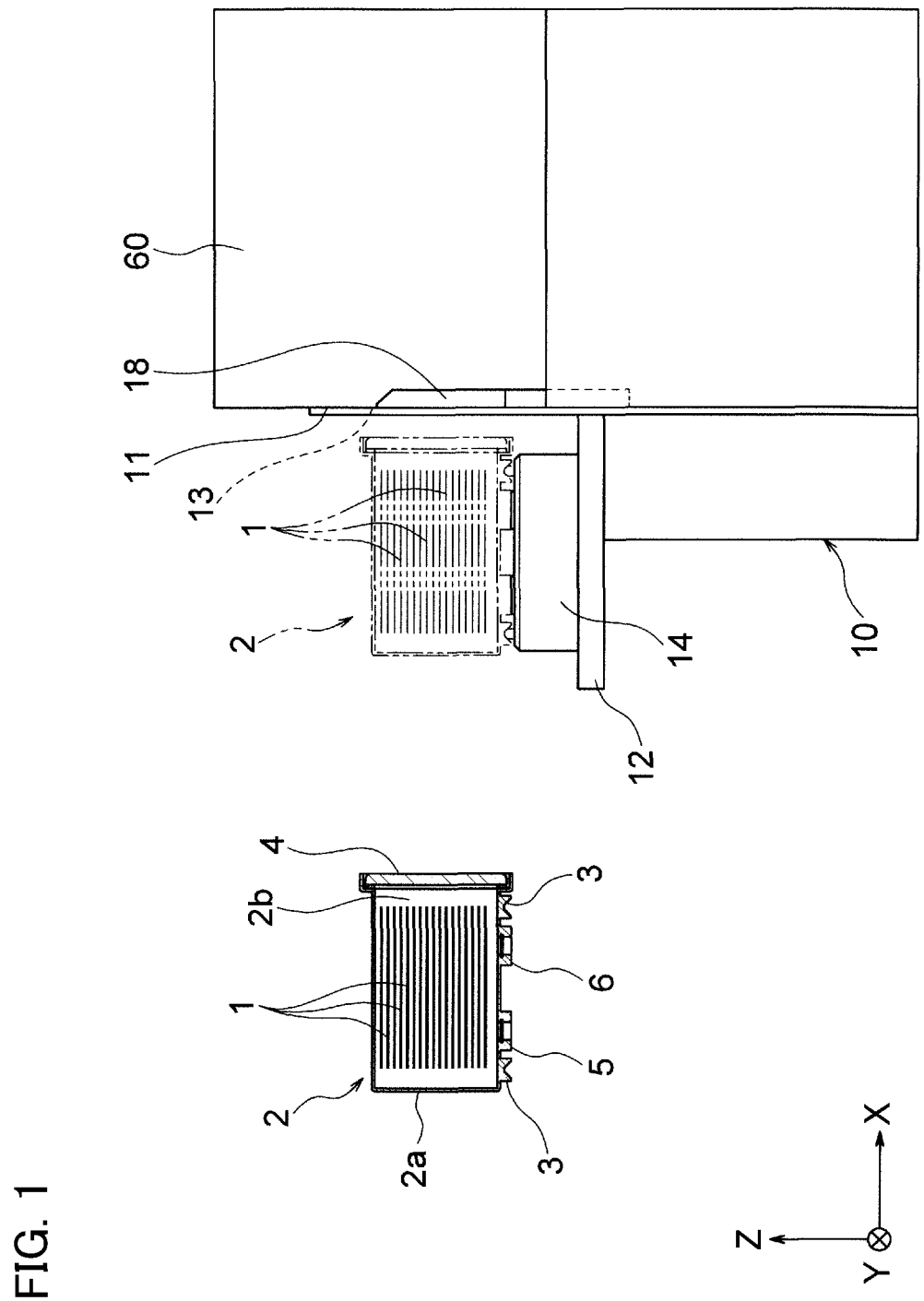
FIG. 1 is a schematic view of a load port apparatus to which a gas purge unit according to one embodiment of the present invention is applied.

As shown in FIG. 1, a load port apparatus 10 according to one embodiment of the present invention is connected to a semiconductor processing apparatus 60. The load port apparatus 10 has an installation stand 12 and a movable table 14. The table 14 is movable in the X-axis direction on the installation stand 12. Note that, in the figures, the X-axis represents a moving direction of the table 14, the Z-axis represents a vertical direction, and the Y-axis represents a direction vertical to the X-axis and the Z-axis.

A sealed transport container 2 can be detachably placed on a top in the Z-axis direction of the table 14. The container 2 is made of a pot, a FOUP, or the like for transporting a plurality of wafers 1 while they are sealed and stored. The container 2 has a casing 2a. A space for housing the wafers 1 to be processed is formed in the casing 2a. The casing 2a has an approximately box shape where an opening is formed on one of its surfaces in the horizontal direction.

Also, the container 2 has a lid 4 for sealing an opening 2b of the casing 2a. Shelves (not shown) for vertically overlapping the wafers 1 held horizontally are arranged in the easing 2a. Each of the wafers 1 placed on the shelves is housed in the container 2 at regular intervals.

The load port apparatus 10 is an interface device for transporting the wafers 1 housed in a sealed state in the container 2 into the semiconductor processing apparatus 60 while maintaining a clean condition. The load port apparatus 10 has a door 18 opening and closing a delivery port 13 of a wall member 11. The wall member 11 is configured to function as part of a casing for sealing inside of the semiconductor processing apparatus 60 in a clean condition, or as part of a casing for sealing inside of an apparatus such as an EFEM connecting the semiconductor processing apparatus 60 and the load port apparatus 10 in a clean condition. The movement of the door 18 will be briefly explained with reference to FIG. 5A to FIG. 5D.

Figure 5A:
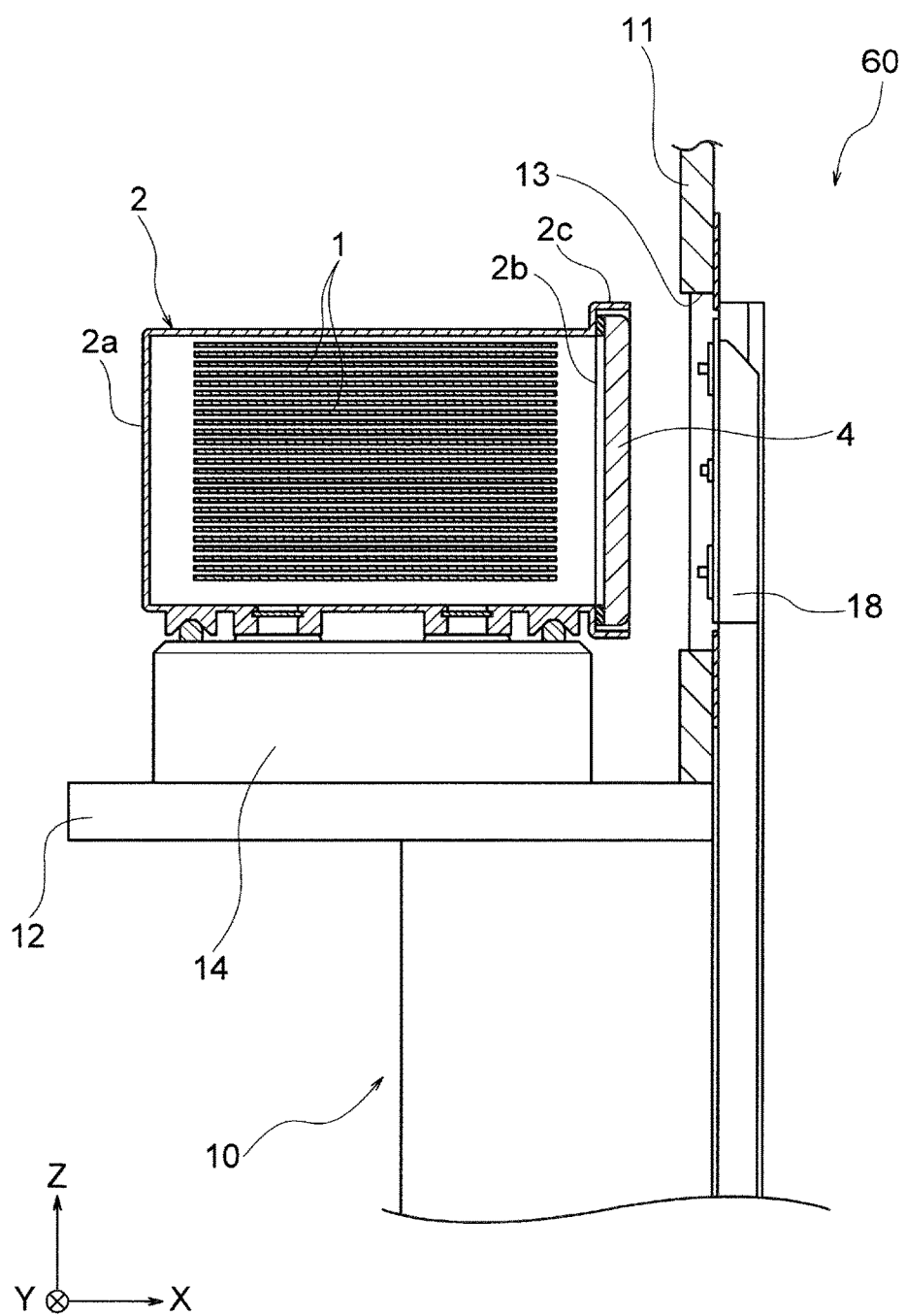
FIG. 5A is a schematic view showing a step where a door of a FOUP is opened by a load port apparatus.
Figure 5B:
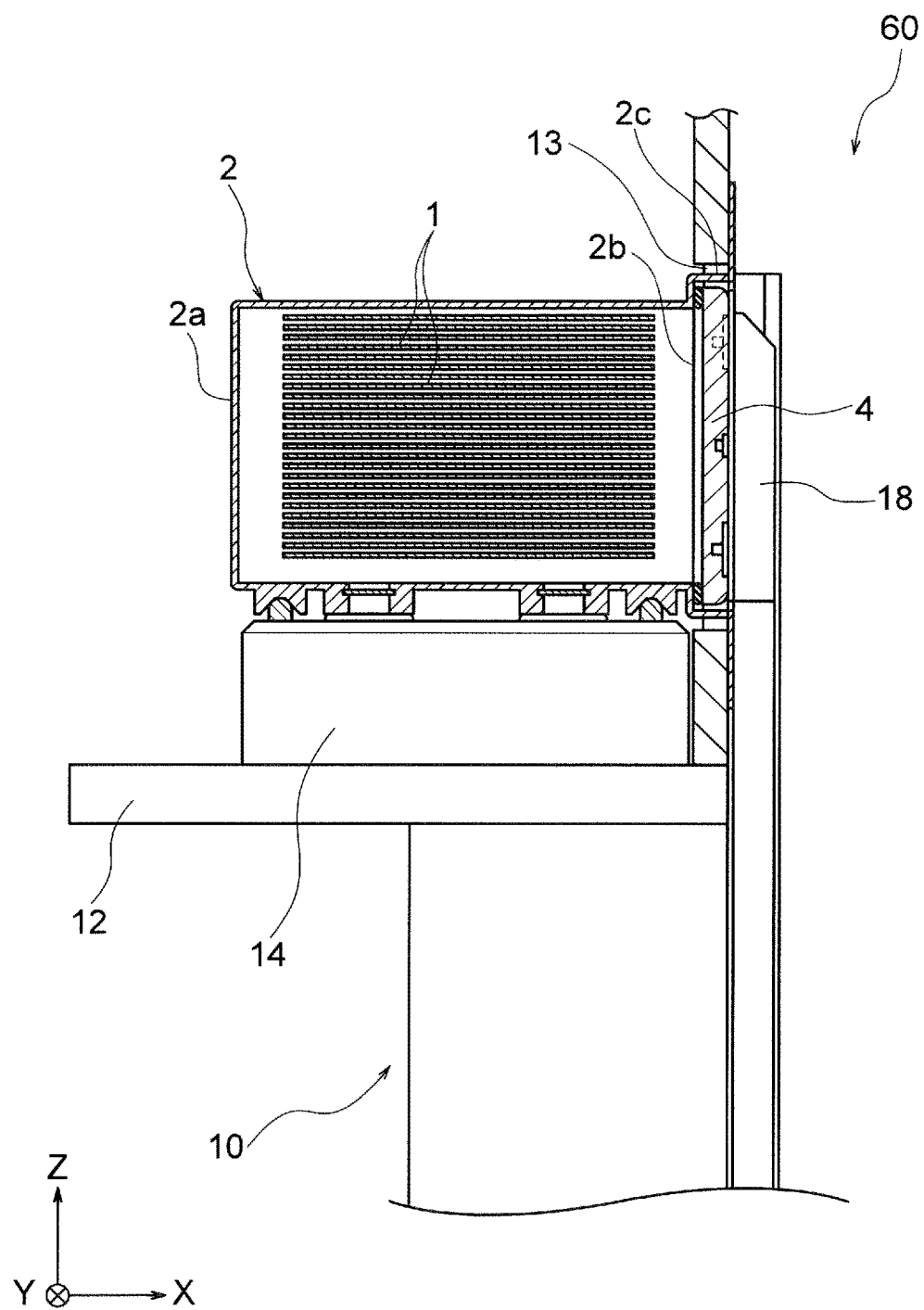
FIG. 5B is a schematic view showing the following step of FIG. 5A.

As shown in FIG. 5A, when the container 2 is installed on the table 14, a bottom gas purge mentioned below is performed. Then, as shown in FIG. 5B, under a condition that the bottom gas purge is being performed, the table 14 is moved in the X-axis direction, and an opening edge 2c with the lid 4 airtightly sealing the opening 2b of the container 2 enters the delivery port 13 of the wall member 11.

Figure 5C:
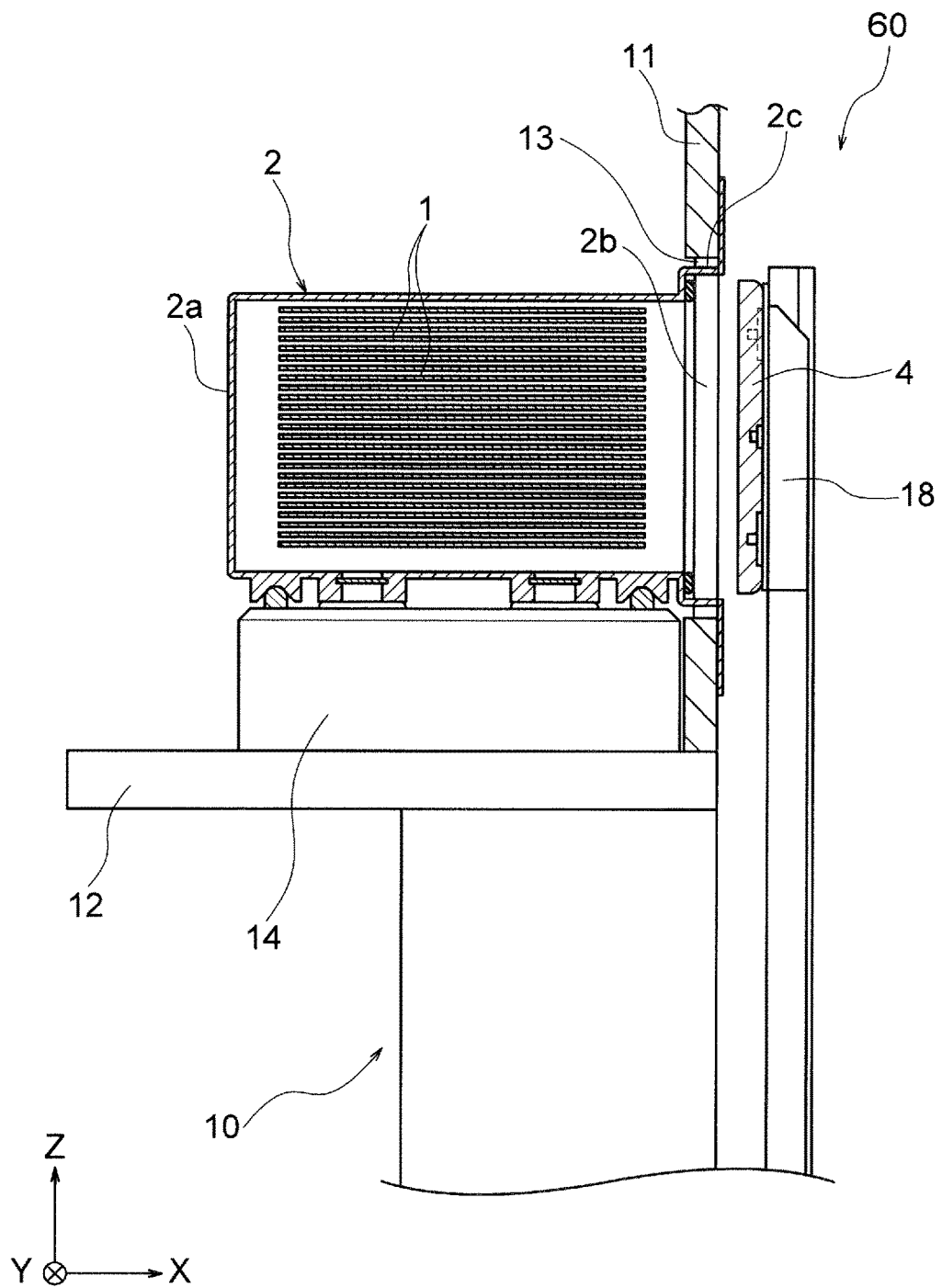
FIG. 5C is a schematic view showing the following step of FIG. 5B.

At the same time, the door 18 located inside of the wall 11 (opposite side to the table 14) is engaged with the lid 4 of the container 2. At that time, a space between the opening edge 2c and an opening edge of the delivery port 13 is sealed by gasket or so, and the space is sealed in a good condition. Thereafter, as shown in FIG. 5C, the container 2 and the wall 11 are internally connected by moving the door 18 together with the lid 4 in parallel along the X-axis direction or moving them rotationally, detaching the lid 4 from the opening edge 2c, and opening the opening 2b. At that time, the bottom gas purge may be continuously operated, or in addition to the bottom purge, a purge gas (cleaning gas), including nitrogen gas or other inert gas, may blow out from the inside of the wall 11 into the container 2 (front purge).

Figure 5D:
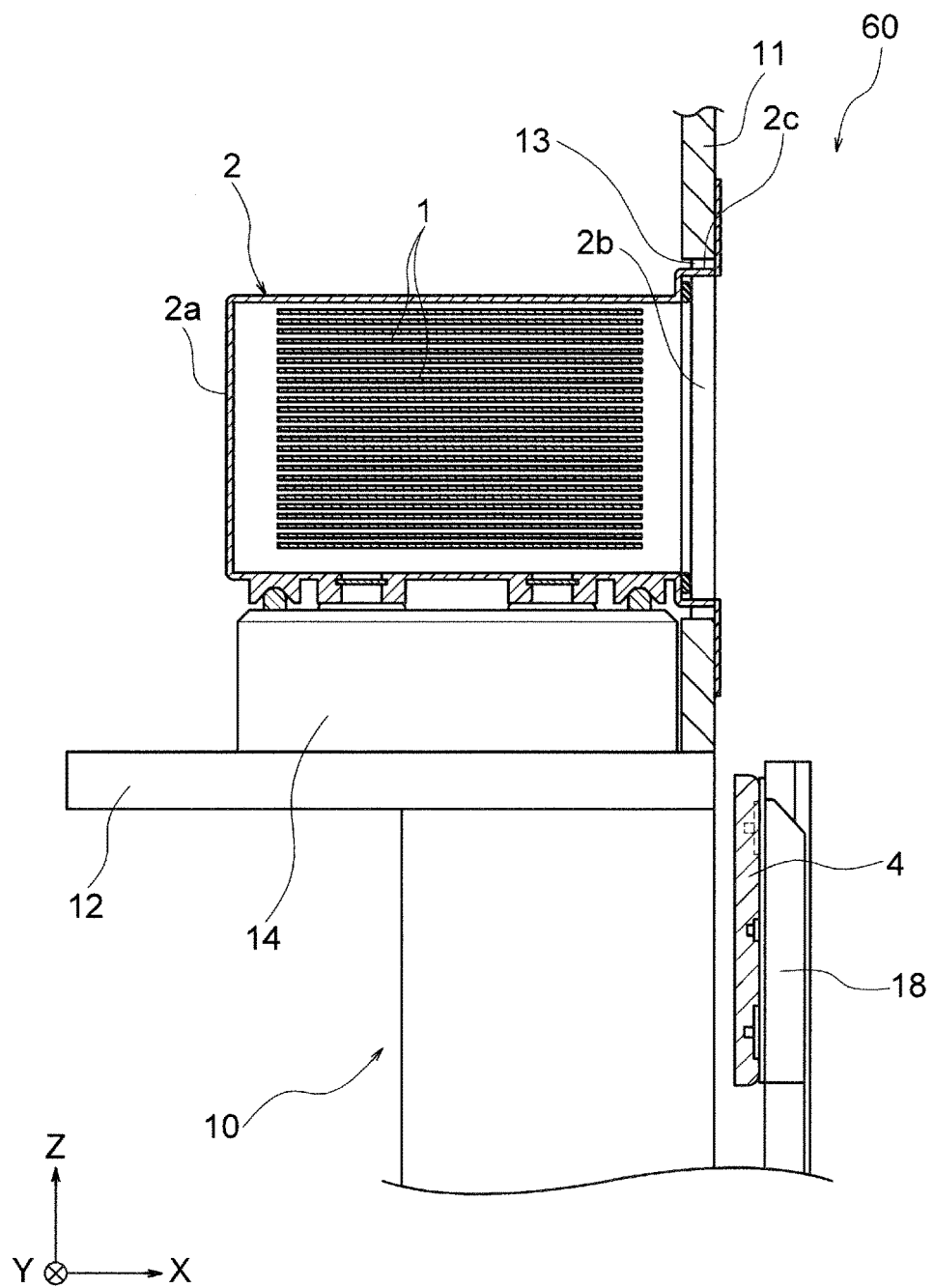
FIG. 5D is a schematic view showing the following step of FIG. 5C.

Next, as shown in FIG. 5D, when the door 18 is moved downward in the Z-axis in the wall 11, the opening 2b of the container 2 is completely opened to the inside of the wall 11, and the wafers 1 are delivered into the wall 11 through the opening 2b by such as a robot hand arranged inside of the wall 11. At that time, the container 2 and the wall 11 are internally cut off from the outside air, and the bottom purge and or the front purge may be continuously operated to maintain a clean environment within the container 2. An operation opposite to the above may be carried out to return the wafers 1 to the inside of the container 2 and detach it from the table 14.

As shown in FIG. 2, one or more positioning pins 16 are embedded on a top surface 14a of the table 14 and engaged with concave parts of the positioning portion 3 arranged on the bottom of the casing 2a. This uniquely determines a positional relation between the container 2 and the table 14.

During storage or transportation of the wafers 1, the sealed transport container 2 is internally sealed, and the surroundings of the wafers 1 are maintained in a clean environment. When the sealed transport container 2 is positioned to be placed on the top surface 14a of the movable table 14, an intake port 5 and an exhaust port 6, which are formed on the bottom surface of the sealed transport container 2, are respectively airtightly connected to an intake pivotable seal apparatus 30 of an intake gas purge unit 20 and an exhaust pivotable seal apparatus 50 of an exhaust gas purge unit 40. In the present embodiment, the bottom gas purge is performed in the container 2 by the intake gas purge unit 20 and the exhaust gas purge unit 40. Note that, in the figures, the purge port 5, the exhaust port 6, the intake gas purge unit 20, the exhaust gas purge unit 40 and the like are illustrated in an enlarged manner compared with the container 2 for easy understanding, but are different from actual dimension ratio.

The intake port 5 and the exhaust port 6 are respectively provided with an intake opening 5a and an exhaust opening, 6a, and they can be connected to inside of the casing 2a via check valves 5b and 6b. The check valve 5b, which is provided in the middle of the intake opening 5a, permits an inflow of a cleaning gas attempting to go into the casing 2a via the intake opening 5a with a predetermined pressure or higher. However, the check valve 5b does not permit an outflow opposite thereto.

The check valve 6b, which is provided in the way of the exhaust opening 6a, permits an outflow of a cleaning gas attempting to go outside from the casing 2a via the exhaust opening 6a with a predetermined pressure or higher. However, the check valve 6b does not permit an inflow opposite thereto. By providing the valves 5b and 6b, the inside of the container 2 is not connected to outside air via the intake opening 5a or the exhaust opening 6a during transportation or storage of the container 2 as long as the gas purge unit 20 or 40 is connected to the intake port 5 or the exhaust port 6.

As shown in FIG. 2, in the present embodiment, the intake gas purge unit 20 and the exhaust gas purge unit 40 have similar structures. The units 20 and 40 are housed inside of the movable table 14. Only heads of the pivotable seal apparatuses 30 and 50 of the units 20 and 40 protrude upward in the Z-axis direction from the top surface 14a of the table 14.

The intake gas purge unit 20 has an intake member 24 provided with an intake passage 22 for providing a cleaning gas such as nitrogen gas or other inert gas. The intake member 24 is arranged inside of the table 14. An intake nozzle 28 provided with a nozzle opening 26 is airtightly connected onto the top of the intake member 24 in the Z-axis direction. Then, the nozzle opening 26 and the intake passage 22 are connected. The nozzle opening 26 is airtightly connected into the intake pivotable seal apparatus 30.

The exhaust gas purge unit 40 has an exhaust member 44 provided with an exhaust passage 42 for exhausting a cleaning gas such as nitrogen gas or other inert gas. The exhaust member 44 is arranged inside of the table 14. An exhaust nozzle 48 provided with a nozzle opening 46 is airtightly connected onto the top of the exhaust member 44 in the Z-axis direction. Then, the nozzle opening 46 and the exhaust passage 42 are connected. The nozzle opening 46 is airtightly connected into the exhaust pivotable seal apparatus 50.

In the present embodiment, the intake pivotal seal apparatus 30 and the exhaust pivotable seal apparatus 50 have the same structure. Thus, only the intake pivotable seal apparatus 30 will be explained in detail, and the exhaust pivotable seal apparatus 50 will not be explained.

Figure 3A:
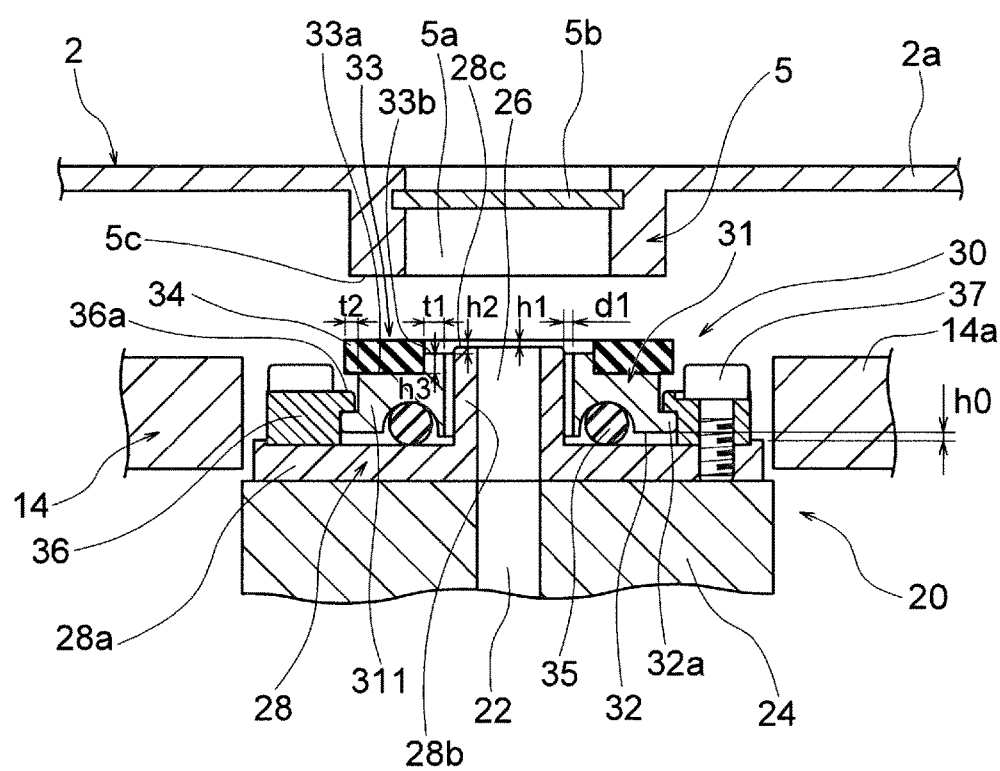
FIG. 3A is a detailed cross-sectional view of a main part of the gas purge unit shown in FIG. 2, and shows a state where an intake port is away from an intake nozzle.

As shown in FIG. 3A, the intake nozzle 28 as a nozzle member has a plate base portion 28a and a cylindrical projection 28b. The cylindrical projection 28b protrudes from the central part of the base portion 28a to upward in the Z-axis direction. The nozzle opening 26 is formed at an internal upper area of the cylindrical projection 28b. The intake pivotable seal apparatus 30 has a pivotable body 31. The pivotable body 31 is arranged in a ring shape to surround the cylindrical projection 28b with a predetermined clearance d1 (one-side clearance).

In the present embodiment, the pivotable body 31 has a contact part 34 with ring plate shape composed of elastic member and a pivotable base portion 311 joined with the contact part 34. In the contact part 34, a housing recess 33a to which the contact part 34 is attached and a positioning projection 33b located inside a radial direction of the housing recess 33a are formed on the pivotable base portion 311 so as to be along an outer circumference of a tip portion 33 of the pivotable body 31. An upper surface of the contact part 34 can detachably contact with the intake port 5. The contact part 34 is joined with the pivotable base portion 311 by means of adhesion of glue or fusion.

The elastic member composing the contact part 34 is composed of synthetic resin, rubber material, or the like, and is preferably composed of rubber material discharging little outgas. The rubber material discharging little outgas includes, for example, fluorine-based rubber, ethylene-propylene rubber (EPM), ethylene propylene dime rubber (EPDM), and the like.

An O-ring groove is formed on a rear end 32 of the pivotable body 31, and an O-ring 35 is housed thereon as a first pivot support portion. The O-ring 35 is held between the rear end 32 of the pivotable body 31 and the base portion 28a of the nozzle 28 in a compressively elastically deformable manner. The size of the O-ring groove is determined so that the O-ring 35 protrudes from the rear end 32 toward the base portion 28a.

A clearance h0 between the rear end 32 of the pivotable body 31 and the top surface of the base portion 28a is determined so that the pivotable body 31 is allowed to pivot for the nozzle 28, and preferably absorbs an angle at which the intake port is inclined. The O-ring 35 compressively elastically deforms within the range of the clearance h0. A clearance d1 between an inner circumferential surface of the pivotable body 31 and an outer circumferential surface of the cylindrical projection 28b is as large as the clearance h0. However, they are not necessarily the same, and the clearance h1 may be larger than the clearance h0. Preferably, the clearance d1 is one where the intake nozzle 28 and the pivotable body 31 are not contacted.

A ring-shaped stopper member 36 is arranged on the outer circumference of the pivotable body 31 and is fixed to the base portion 28a of the nozzle 28 by a bolt 37 or so. An inner engagement piece 36a is continuously or intermittently formed along the circumferential direction on an inner circumferential upper edge of the stopper member 36. The inner engagement piece 36a is engaged with an outer engagement piece 32a formed continuously or intermittently along the circumferential direction on an outer circumferential lower portion of the pivotable base portion 311 of the pivotable body 31.

As a result, the pivotable body 31 is not limited to move toward the base portion 28a, but is limited to move from the base portion 28a of the nozzle member 28 toward the intake port 5. That is, within the range of the predetermined clearance h0, the pivotable body 31 can pivot due to the elastic deformation of part of the O-ring 35. Note that, the stopper member 36 may be arranged intermittently along the circumferential direction.

In the present embodiment, the upper surface of the contact part 34 is arranged to protrude toward the container 2 more than a tip 28c of the cylindrical projection 28b with the predetermined height h1. In this arrangement, the tip 28c of the nozzle 28 can be effectively prevented from impacting on the intake port 5. Note that, when the tip of the nozzle 28 goes into the intake opening 5a without impacting on the intake port 5, the contact part 34 may not be arranged to protrude toward the container 2 more than the tip 28c of the cylindrical projection 28b.

In the present embodiment, the upper surface of the contact part 34 is arranged to protrude toward the container 2 more than a tip of the positioning projection 33b of the pivotable base portion 311 with a predetermined height h2. In this arrangement, the tip of the positioning projection 33b of the pivotable base portion 311 can be effectively prevented from impacting on the intake port 5. Note that, when the tip of the positioning projection 33b goes into the intake opening 5a without impacting on the intake port 5, the contact part 34 may not be arranged to protrude toward the container 2 more than the tip of the positioning projection 33b.

A Z-axis direction height h3 of the housing recess 33a is determined in view of positioning, and is not limited. A radial width t1 of the positioning projection 33b is also determined in view of positioning, and is not limited. The positioning projection 33b should be provided for positioning of the contact part 34, but may not be formed if positioning is performed by another means. In this case, t1 and h3 are zero. The outer circumferential surface of the contact part 34 is preferably flush with the outer circumferential surface of the pivotable base portion 311, but may protrude from the outer circumferential surface of the pivotable base portion 311 with a predetermined t2 or may be dented on the contrary.

The pivotable base portion 311 of the pivotable body 31 is preferably harder than the elastically deformable O-ring 35 and is also preferably hard not to be deformed even if the O-ring 35 is deformed when the contact part 34 contacts with the intake opening 5a. For example, the O-ring 35 is comprised of material which does not pass through gas and has enough thickness. The O-ring 35 is specifically comprised of such as rubber, soft plastic, or sponge. As is the case with the rubber material composing, the contact part 34, the O-ring 35 is preferably composed of rubber material discharging little outgas, but is not necessarily be composed of the same material.

The pivotable base portion 311 is made from a material having poor elasticity, large hardness, and a feature of preventing gas from passing through at an operating pressure. The pivotable base portion 311 is specifically comprised of metal such as aluminum, steel, copper, or titanium, but is not limited to be comprised thereof as long as it is comprised of a material having a large hardness. The pivotable body 31 may be comprised of such as plastic, glass, or rubber.

Since the pivotable base portion 311 is composed of hard material, such as metal, a portion where elasticity is needed can be reduced to the minimum, and a risk of generation of particles etc. can be further reduced. In particular, a portion of the pivotable base portion 311 where the outer engagement piece 32a is formed is engaged with the inner engagement piece 36a of the stopper member 36, and is preferably composed of metal etc. The stopper member 36 is also preferably composed of metal etc.

Note that, in the present embodiment, the contact part 34 is separately formed from the pivotable base portion 311, but may be formed integrally with the pivotable base portion 311 by elastic member. In this case, only the pivotable base portion 311 may be reformed to a portion that is harder than the contact part 34. On the contrary, only the contact part 34 may have an enhanced elasticity by integrally forming the contact part 34 and the pivotable base portion 311 with a high rigidity member.

In the present embodiment, the O-ring 35 and the pivotable base portion 311 are separately formed, but may be formed integrally by elastic member. In this case, only a portion corresponding to the pivotable base portion 311 may be reformed to a portion that is harder than a portion corresponding to the O-ring 35. On the contrary, only the portion corresponding to the O-ring 35 may have an enhanced elasticity by integrally forming the portion corresponding to the O-ring 35 and the pivotable base portion 311 with a high rigidity member.

Figure 3B:
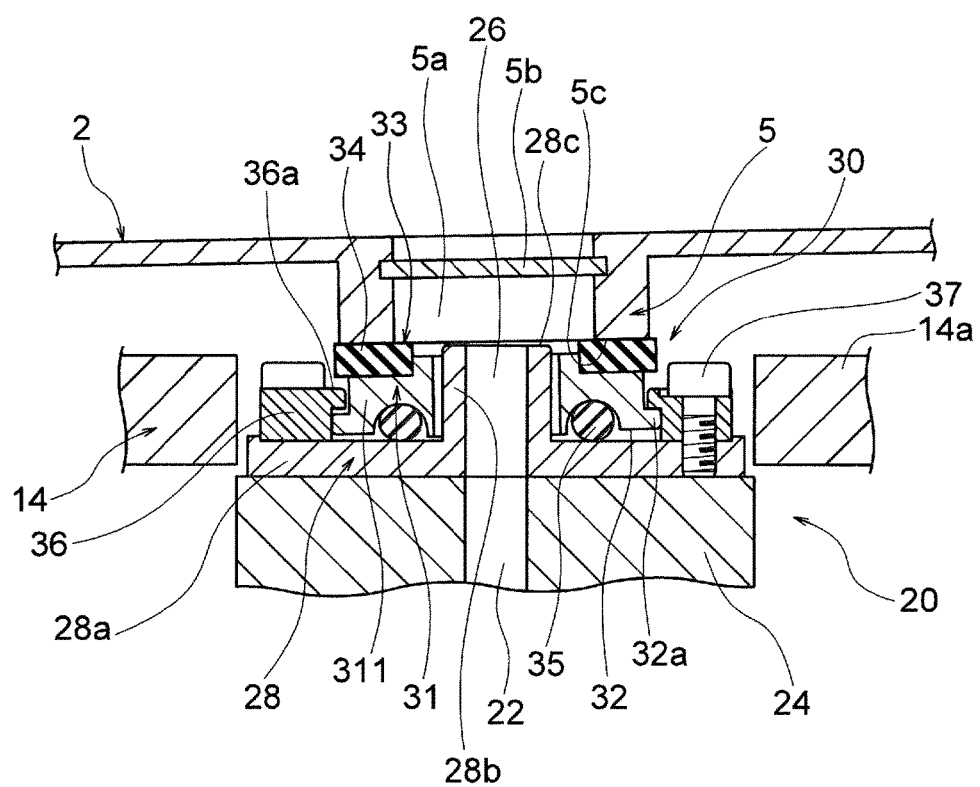
FIG. 3B is a detailed cross-sectional view of a main part of the gas purge unit shown in FIG. 2, and shows a state where an intake port is inclined and attached to an intake nozzle.

As shown in FIG. 3A and FIG. 3B, the upper surface of the contact part 34 contacts with a contact bottom surface 5c surrounding the intake opening 5a of the intake port 5. A gasket sheet for sealing not shown may be mounted on the contact bottom surface 5c, but the contact bottom surface 5c may be a metal surface. In this case, if the contact part 34 is elastic member, adhesive force between the contact part 34 and the contact bottom surface 5c is particularly improved.

As shown in FIG. 3B, the O-ring 35 is composed of a compressively elastically deformable material such as rubber. Thus, even if the container 2 is placed to be inclined toward the table 14 to some degree, airtightness of the container 2 is maintained because the O-ring 35 elastically deforms, the pivotable body 31 pivots, and the upper surface of the ring-shaped contact part 34 is in close contact with the contact bottom surface 5c over the whole circumference.

When a purge gas is supplied to the intake passage 22 in a condition shown in FIG. 3B, an internal pressure of the nozzle opening 26 is heightened, the check valve 5b opens, and the purge gas is supplied from the nozzle opening 26 into the container 2 via the intake opening 5a. In the container 2, pressure is heightened by the purge gas, and the check valve 6b of the exhaust opening 6a shown in FIG. 2 opens. Then, the purge gas is exhausted via the exhaust opening 6a, the nozzle opening 46, and the exhaust passage 42. Thus, the container 2 is filled with a clean purge gas, which improves cleanliness of inside of the container 2.

In the gas purge units 20 and 40 of the present invention, the contact part 34, which is provided with the tip portion of the pivotable body 31 provided with the intake nozzle 28 (or the exhaust nozzle 48, in the same hereinafter), is detachably contacted with the intake port 5 (or the exhaust port 6, in the same hereinafter) of the container 2. The pivotable body 31 with the contact part 34 is supported by the ring-shaped O-ring 35, and the O-ring 35 deforms compressively elastically along the longitudinal direction of the cylindrical projection 28b. As a result, the pivotable body 31 pivots.

Thus, as shown in FIG. 3B, even when the intake port 5 is displaced positionally or inclined due to positional displacement or inclination of the container 2, the O-ring 35 compressively elastically deforms, which makes the pivotable body 31 pivot in accordance with positional displacement or inclination of the container 2. As a result, the contact part 34 formed at the tip portion 33 of the pivotable body 31 is closely contacted with the intake port 5 around the intake opening 5a (or the exhaust opening 6a, in the same hereinafter). The O-ring 35 is arranged between the rear end 32 of the pivotable body 31 and the base portion 28a of the nozzle 28 in an elastically deformable manner, and functions as a seal member. Thus, the seal performance therebetween is maintained. Thus, the pivotable body 31 can satisfactorily isolate and seat the nozzle opening 26 and the intake opening 5a from outside air, and they can be airtightly connected.

Further, since the contact part 34 is composed of elastic member, the flowing port 5 and the pivotable body 31 closely contact with each other even if the contact bottom surface 5c of the flowing port 5, where the contact part 34 contacts, is composed of hard material. In this respect too, the pivotable body 31 can isolate and seal the nozzle opening 26 and the intake opening 5a from outside air, and they can be airtightly connected. Note that, this is the case even if the bottom surface 5c of the flowing port 5, where the contact part 34 contacts, is composed of soft material.

Thus, the purge gas supplied (or exhausted, in the same hereinafter) from the nozzle opening 26 can flow (or exhaust, in the same hereinafter) into the container 2 from the intake opening 5a, without leaking to outside or mixing outside air thereinto, satisfactorily fill inside thereof with the purge gas, and maintain the inside in a clean condition.

Note that, the O-ring 35 just compressively elastically deforms between the rear end 32 of the pivotable body 31 and the base portion 28a of the nozzle 28, and is then hardly rubbed. Thus, particles or so due to rubbing hardly occur. Further, since the O-ring 35 enables the pivotable body 31 to pivot by just deforming compressively elastically, the pivotable portion moves smoothly, following capability is excellent, and a clearance between the nozzle 28 and the intake port 5 is hardly formed.

Further, in the present embodiment, since the nozzle 28 with the nozzle opening 26, the movable portion (pivotable body 31), and a position adjusting portion (O-ring 35) are independently constituted, the nozzle 28 itself is not inclined and the seal performance does not deteriorate without lowering of movability caused by a deposition on the nozzle 28. In addition, the nozzle 28 itself is not inclined, which makes it easier to supply the cleaning gas thereto. Further, since an elastically deformable portion should just be formed in a local position, the nozzle 28 can be made smaller as a whole.

In the present embodiment, the pivotable body 31 is arranged in a ring shape to surround the cylindrical projection 28b, and the nozzle opening 26 is formed at the tip of the cylindrical projection 28b. Thus, a distance between the O-ring 35 and the nozzle opening 26 is made larger, and there is little risk that particles possibly caused by the O-ring 35 are mixed from the nozzle opening 26 into the container 2.

Further, in the present embodiment, the gas purge unit has the stopper member 36. Thus, when the nozzle 28 is detached from the intake port 5, the pivotable body 31 is forced to be detached from the intake port 5 along with the nozzle 28, so that it is possible to effectively prevent the contact part 34 of the pivotable body 31 from adhering to the intake port 5. Further, the stopper member 36 also has a function of aligning the pivotable body 31 and the nozzle opening 26 of the nozzle 28.

Second Embodiment

Figure 4A:
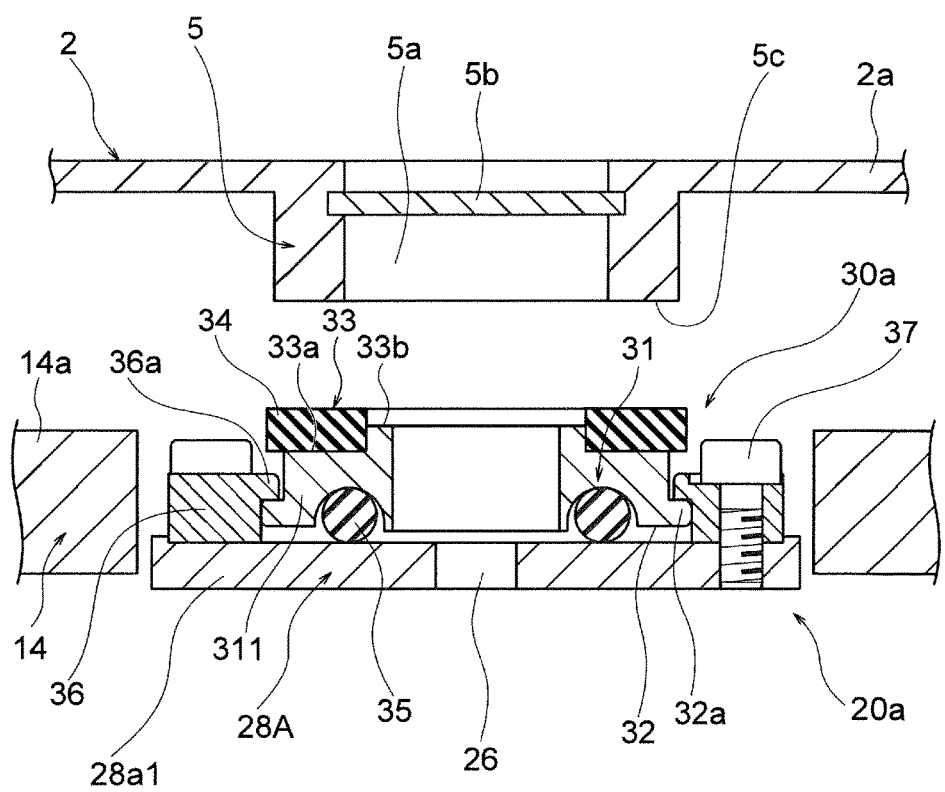
FIG. 4A is a cross-sectional view of a main part of a pivotable seal apparatus used for a gas purge unit according to another embodiment of the present invention.

FIG. 4A is a cross sectional view of a main part of a pivotable seal apparatus 30a used for a gas purge unit 20a according to other embodiment of the present invention. The pivotable seal apparatus 30a is used for either or both of intake and exhaust. Except for the following, the second embodiment has structures similar to the first embodiment mentioned above and demonstrates similar effects.

As shown in FIG. 4A, in this embodiment, a nozzle opening 26 is directly formed in a base portion 28a1 of an intake nozzle 28A, and the cylindrical projection 28b mentioned in the first embodiment is not present. Other structures are similar to the first embodiment mentioned above.

In this embodiment, an inner circumferential surface of a pivotable body 31 serves as a part of the nozzle opening 26. In the present embodiment, since the cylindrical protection 28b is not present, structures become simpler than the first embodiment. Other effects of the present embodiment are similar to the first embodiment except that effects demonstrated by having the cylindrical projection 28b of the first embodiment are not obtained.

Third Embodiment

Figure 4B:
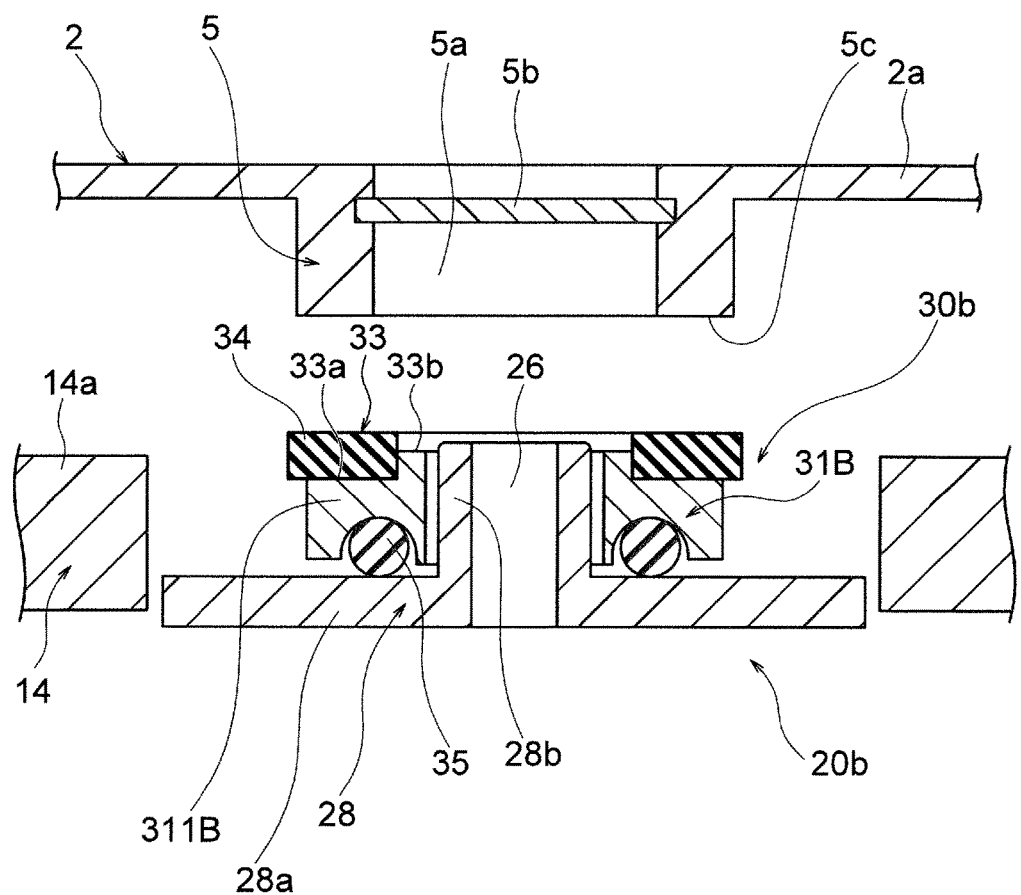
FIG. 4B is a cross-sectional view of a main part of a pivotable seal apparatus used for a gas purge unit according to further another embodiment of the present invention.

FIG. 4B is a cross sectional view of a main part of a pivotable seal apparatus 30b used for a gas purge unit 20b according to further other embodiment of the present invention. The pivotable seal apparatus 30b is used for either or both of intake and exhaust. Except for the following, the third embodiment has structures similar to the first embodiment mentioned above and demonstrates similar effects.

As shown in FIG. 4B, this embodiment has structures similar to the first embodiment mentioned above except that the stopper member 36 of the first embodiment is not present. That is, in this embodiment the stopper member 36 of the first embodiment is not formed on an outer circumference of a pivotable body 31B. Thus, an outer engagement piece 32a shown in FIG. 4A does not need to be formed on an outer circumferential lower portion of a pivotable base portion 311B of the pivotable body 31.

In this embodiment, the pivotable body 31B is arranged in a ring shape to surround a cylindrical projection 28b. Thus, a nozzle opening 26 and the pivotable body 31B are positioned in the self-alignment manner even if the stopper member 36 is not present. In the present embodiment, since the stopper member 36 is not present, structures become simpler than the first embodiment. Other effects of the present embodiment are similar to the first embodiment except that effects demonstrated by having the stopper member 36 of the first embodiment are not obtained.

Fourth Embodiment

Figure 4C:
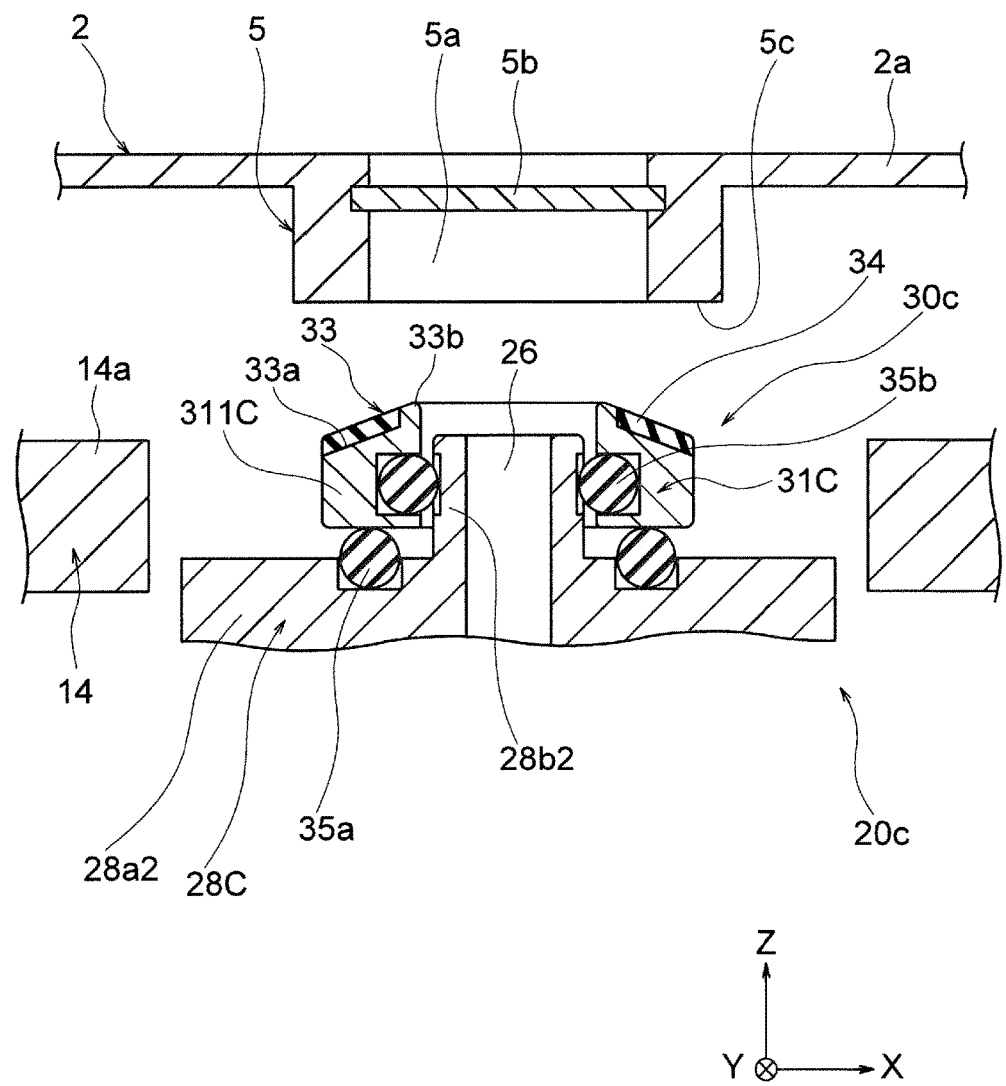
FIG. 4C is a cross-sectional view of a main part of a pivotable seal apparatus used for a gas purge unit according to further another embodiment of the present invention.

FIG. 4C is a cross sectional view of a main part of a pivotable seal apparatus 30c used for a gas purge unit 20c according to further other embodiment of the present invention. The pivotable seal apparatus 30c is used for either or both of intake and exhaust. Except for the following, the fourth embodiment has structures similar to the third embodiment mentioned above and demonstrates similar effects.

As shown in FIG. 4C, the pivotable seal apparatus 30c of this embodiment has a first O-ring 35a and a second O-ring 35b as the pivot support bodies bolding a pivotable body 31C pivotably to an intake nozzle 28C. The first O-ring 35a is housed in an O-ring groove formed on a base portion 28a2, which is located around a cylindrical projection 28b2 of a nozzle 28C. The first O-ring 35a corresponds to the O-ring 35 of the embodiments mentioned above, and has function similar thereto.

The second O-ring 35b is a ring-shaped seal member held between an inner circumferential portion of the pivotable body 31C and an outer circumferential portion of the cylindrical projection 28b2 in a compressively elastically deformable manner along directions (the X-axis and Y-axis plane directions) vertical to a longitudinal direction of the cylindrical projection 28b2. The first O-ring 35a and the second O-ring 35b are composed of the same material as the O-ring 35 in the previous embodiments, but are not be necessarily composed of the same material.

In the present embodiment, the first O-ring 35a and the second O-ring 35b function as two seal members, which further improves seal performance between the nozzle 28C and the pivotable body 31C. By providing the second O-ring 35b, it is possible to effectively prevent the inner circumferential surface of the pivotable body 31C from impacting on the outer circumferential surface of the cylindrical projection 28b2 even if the pivotable body 31C pivots.

In the present embodiment, an O-ring groove is formed on the inner circumferential surface of a pivotable base portion 311C of the pivotable body 31C to provide the second O-ring 35b between the cylindrical projection 28b2 and the pivotable body 31C. A shallow groove for positioning the O-ring is also formed on the outer circumferential surface of the cylindrical projection 28b2 at a position corresponding to the O-ring groove in the Z-axis direction.

In the present embodiment, a contact part 34 having a tapered slope where an outer diameter becomes narrower on the side of the tip is joined with a housing recess 33a of the pivotable base portion 311C on a tip portion 33 of the pivotable body 31C. A tip surface of a positioning projection 33b is a slope that is flush with the contact part 34. The tip surface of the positioning projection 33b and the tip of the contact part 34 go into an intake opening 5a of an intake port 5, and an intermediate positional part of the tapered slope consisting the contact part 34 is then sealed by contacting with an inner edge of the intake opening 5a of the port 5. Other elects of the present embodiment are similar to the third embodiment shown in FIG. 4B except that effects based on having the second O-ring 35b are added.

Fifth Embodiment

Figure 4D:
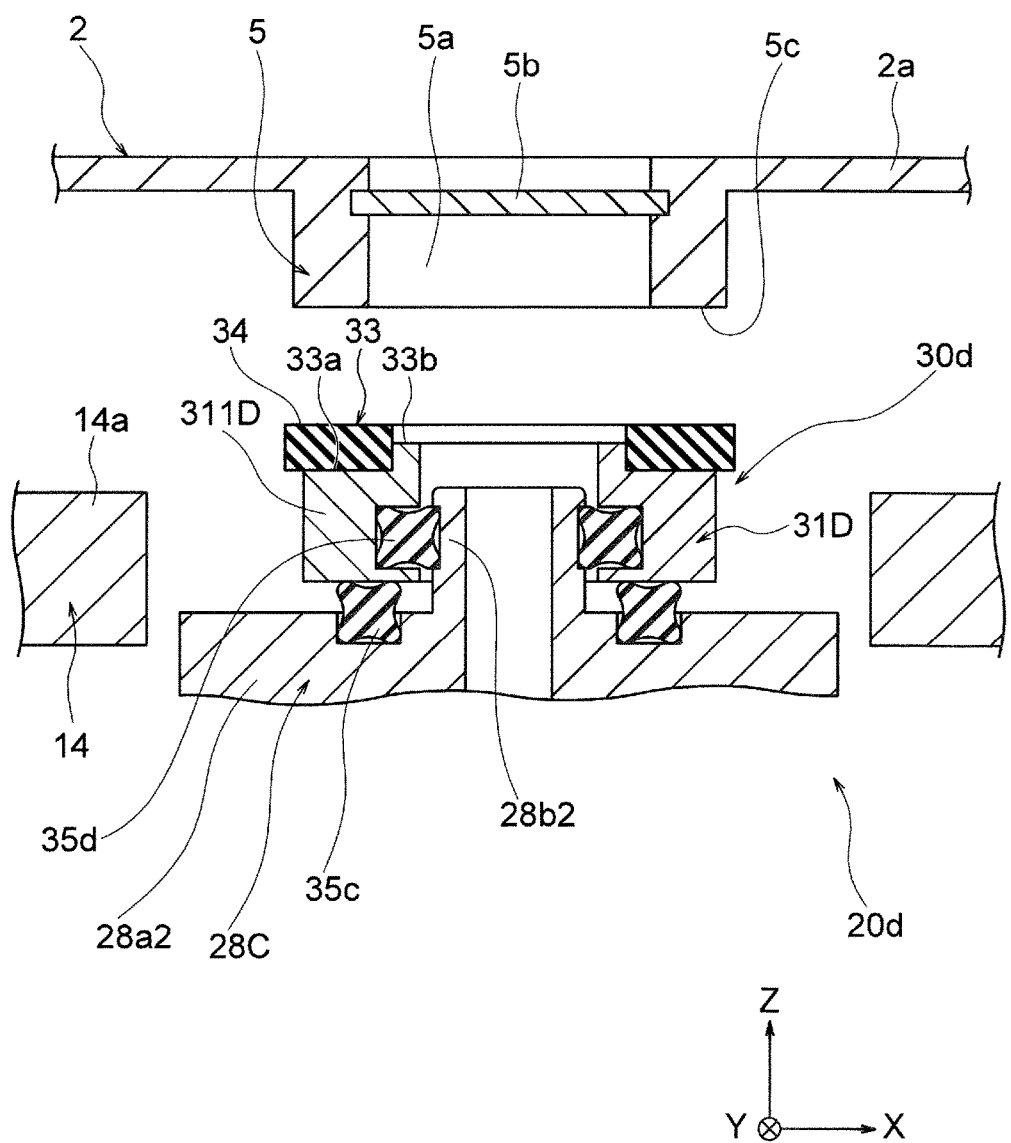
FIG. 4D is a cross-sectional view of a main part of a pivotable seal apparatus used for a gas purge unit according to further another embodiment of the present invention.

FIG. 4D is a cross sectional view of a main part of a pivotable seal apparatus 30d used for a gas purge unit 20d according to further other embodiment of the present invention. The pivotable seal apparatus 30d is used for either or both of intake and exhaust. Except for the following, the fifth embodiment has structures similar to the fourth embodiment mentioned above and demonstrates similar effects.

As shown in FIG. 4D, the pivotable seal apparatus 30d of this embodiment is a variation of the pivotable seal apparatus 30c of the embodiment shown in FIG. 4C and is different from the example shown in FIG. 4 in cross sectional shape of a first O-ring 35c and a second O-ring 35d. That is, although the cross sectional shape of the O-rings of the embodiments mentioned above is a circle, cross sectional shape of the O-rings 35c and 35d of this embodiment is a rectangle as a whole. Each side of the rectangle is dented, and corners thereof protrude.

The O-rings 35c and 35d with such a cross sectional shape are favorably housed in O-ring grooves and are hard to be displaced. Since the O-rings 35c and 35d can be compressively elastically deformed in a relatively wide range, a pivotable body 31D is expected to pivot in a wider range. Other effects of the present embodiment are similar to the fourth embodiment shown in FIG. 4C. Note that unlike the fourth embodiment, the contact part 34 joined with the tip portion 33 of a pivotable base portion 311D does not have a tapered slope in the present embodiment. This contact part 34 has an upper surface that is parallel to a plane including the X-axis and the Y-axis, and is a ring-shaped contact part as with the first embodiment.

Note that, the present invention is not limited to the embodiments mentioned above, but can be variously changed within a scope thereof.

For example, the gas purge units 20 and 40 may not be necessarily comprised of the same structures, but may be comprised of different structures. For example, one of the gas purge units 20 and 40 may have one of the pivotable seal apparatuses of FIG. 3A and FIG. 4A to FIG. 4D, and the other gas purge unit may have a pivotable seal apparatus other than the pivotable seal apparatus. Instead, either the gas purge unit 20 or 40 may be only comprised of structures of the gas purge unit according to the present invention.

In the above embodiments, the O-rings are used as pivot support bodies. However, in addition to the O-rings, other seal members compressively elastically deformable such as packing or gasket may be also used.

In the embodiments mentioned above, the gas purge unit of the present invention is applied to the load port apparatus 10, but may be applied to other devices. For example, the gas purge unit of the present invention may be attached to such as shelves or installation stands for spreading and storing a plurality of the containers 2. Instead, the gas purge unit of the present invention may be provided with other devices or places.

NUMERICAL REFERENCES

1 . . . wafer
2 . . . sealed transport container
2a . . . casing
2b . . . opening
2c . . . opening edge
3 . . . positioning portion
4 . . . lid
5 . . . intake port (flowing port)
5a . . . intake opening (flowing opening)
6 . . . exhaust port (flowing port)
6a . . . exhaust opening (flowing opening)
10 . . . load port apparatus
11 . . . wall member
12 . . . installation stand
13 . . . delivery port
14 . . . movable table
16 . . . positioning pin
18 . . . door
20, 20a to 20d . . . intake gas purge unit
22 . . . intake passage
24 . . . intake member
26 . . . nozzle opening
28, 28A . . . intake nozzle (nozzle member)
28a, 28a1, 28a2 . . . base portion
28b, 28b2 . . . cylindrical projection
30, 30a to 30d . . . intake pivotable seal apparatus
31, 31B, 31C, 31D . . . pivotable body
311, 311B, 311C, 311D . . . pivotable base portion
32 . . . rear end
32a . . . outer engagement piece
33 . . . tip portion
33a . . . housing recess
33b . . . positioning projection
34 . . . contact part
35 . . . O-ring (first pivot support portion)
35a, 35c . . . first O-ring (first pivot support portion)
35b, 35d . . . second O-ring (second pivot support portion)
36 . . . stopper member
36a . . . inner engagement piece
37 . . . bolt
40 . . . exhaust gas purge unit
43 . . . exhaust passage
44 . . . exhaust member
46 . . . nozzle opening
48 . . . exhaust nozzle (nozzle member)
50 . . . exhaust pivotable seal apparatus
60 . . . semiconductor processing apparatus

The invention claimed is:

1. A gas purge unit for flowing a cleaning gas into a purging container having a flowing port with a flowing opening via the flowing port, comprising:
 a nozzle member provided with a nozzle opening for flowing the cleaning gas and a cylindrical projection projecting from an upper surface of a base portion to upward;
 a pivotable body arranged in ring shape on the base portion to surround the cylindrical projection with a first space and provided with a contact part capable of detachably contacting with the flowing port on a tip portion of the pivotable body; and
 a first pivot support portion with ring shape held between a rear end of the pivotable body and the base portion in a compressively elastically deformable manner along a longitudinal direction of the cylindrical projection,
 wherein:
 the contact part is composed of an elastic member;
 a second space is formed between the rear end of the pivotable body and the upper surface of the base portion;
 the first space and the second space allow the pivotable body to pivot with respect to the nozzle member and absorb an angle of inclination of the pivotable body; and
 the pivotable support portion is compressively elastically deformed in a range of the first space and the second space.

2. The gas purge unit as set forth in claim 1, wherein the contact part is arranged to protrude toward the purging container more than a tip of the cylindrical projection.

3. The gas purge unit as set forth in claim 2, further comprising:
 a second pivot support portion with ring shape held between an inner circumferential portion of the pivotable body and an outer circumferential portion of the cylindrical projection in a compressively elastically deformable manner along a direction vertical to the longitudinal direction of the cylindrical projection.

4. The gas purge unit as set forth in claim 3, further comprising:
 a stopper member configured to restrict the pivotable body to moving from the base portion of the nozzle member toward the flowing port and configured to fail to restrict the pivotable body to moving toward the base portion.

5. The gas purge unit as set forth in claim 2, further comprising:
 a stopper member configured to restrict the pivotable body to moving from the base portion of the nozzle member toward the flowing port and configured to fail to restrict the pivotable body to moving toward the base portion.

6. The gas purge unit as set forth in claim 1, further comprising:
 a second pivot support portion with ring shape held between an inner circumferential portion of the pivotable body and an outer circumferential portion of the cylindrical projection in a compressively elastically deformable manner along a direction vertical to the longitudinal direction of the cylindrical projection.

7. The gas purge unit as set forth in claim 6, further comprising:
 a stopper member configured to restrict the pivotable body to moving from the base portion of the nozzle member toward the flowing port and configured to fail to restrict the pivotable body to moving toward the base portion.

8. The gas purge unit as set forth in claim 1, further comprising:
 a stopper member configured to restrict the pivotable body to moving from the base portion of the nozzle member toward the flowing port and configured to fail to restrict the pivotable body to moving toward the base portion.

9. The gas purge unit as set forth in claim 1, wherein
the pivotable body has the contact part composed of an elastic member and a pivotable base portion joined with the contact part and
the pivotable base portion is composed of metal.

10. The gas purge unit as set forth in claim 9, wherein
a housing recess to which the contact part is attached and a positioning projection located inside a radial direction of the housing recess are formed on the pivotable base portion.

11. The gas purge unit as set forth in claim 1, wherein
the elastic member is composed of rubber material discharging little outgas.

12. A load port apparatus comprising the gas purge unit as set forth in claim 1.

13. An installation stand for a purging container including the gas purge unit as set forth in claim 1.

14. A gas purge unit for flowing a cleaning gas into a purging container having a flowing port with a flowing opening via the flowing port, comprising:
   a nozzle member provided with a nozzle opening for flowing the cleaning gas on a top surface of a base portion;
   a pivotable body arranged in ring shape on the base portion to surround the nozzle opening and provided with a contact part capable of detachably contacting with the flowing port;
   a pivot support portion with ring shape held between a rear end of the pivotable body and the base portion of the nozzle member in a compressively elastically deformable manner; and
   a stopper member configured to restrict the pivotable body to moving from the base portion of the nozzle member toward the flowing port and configured to fail to restrict the pivotable body to moving toward the base portion,
wherein:
the contact part is composed of an elastic member;
a space is formed between the rear end of the pivotable body and the upper surface of the base portion so as to allow the pivotable body to pivot with respect to the nozzle member and absorb an angle of inclination of the pivotable body; and
the pivotable support portion is compressively elastically deformed in a range of the space.

15. The gas purge unit as set forth in claim 14, wherein
the pivotable body has the contact part composed of an elastic member and a pivotable base portion joined with the contact part and
the pivotable base portion is composed of metal.

16. The gas purge unit as set forth in claim 15, wherein
a housing recess to which the contact pint is attached and a positioning projection located inside a radial direction of the housing recess are formed on the pivotable base portion.

17. The gas purge unit as set forth in claim 14, wherein
the elastic member is composed of rubber material discharging little outgas.

18. A load port apparatus comprising the gas purge unit as set forth in claim 14.

19. An installation stand for a purging container including the gas purge unit as set forth in claim 14.

* * * * *